(12) United States Patent
Sander et al.

(10) Patent No.: US 10,277,219 B2
(45) Date of Patent: Apr. 30, 2019

(54) ELECTRONIC SWITCHING AND REVERSE POLARITY PROTECTION CIRCUIT

(71) Applicant: Infineon Technologies AG, Neubiberg (DE)

(72) Inventors: Rainald Sander, Oberhaching (DE); Andreas Meiser, Sauerlach (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/639,834

(22) Filed: Jun. 30, 2017

(65) Prior Publication Data
US 2018/0006639 A1 Jan. 4, 2018

(30) Foreign Application Priority Data
Jul. 4, 2016 (DE) .................. 10 2016 112 162

(51) Int. Cl.
*H03K 17/08* (2006.01)
*H01L 23/00* (2006.01)

(52) U.S. Cl.
CPC ............. *H03K 17/08* (2013.01); *H01L 24/05* (2013.01); *H01L 24/45* (2013.01)

(58) Field of Classification Search
None
See application file for complete search history.

(56) References Cited

U.S. PATENT DOCUMENTS

| 2007/0187629 A1 | 8/2007 | Matsuyama |
| 2007/0274110 A1 | 11/2007 | Kitamura et al. |
| 2011/0297964 A1 | 12/2011 | Miura |
| 2014/0160600 A1 | 6/2014 | Maggio et al. |
| 2015/0214928 A1* | 7/2015 | Vashishtha ........... H03K 17/687 327/108 |
| 2016/0043720 A1 | 2/2016 | Kubota et al. |
| 2016/0189887 A1* | 6/2016 | Weis ..................... H03K 17/06 307/113 |

FOREIGN PATENT DOCUMENTS

WO 2016016797 A2 2/2016

* cited by examiner

*Primary Examiner* — Cassandra Cox
(74) *Attorney, Agent, or Firm* — Slater Matsil, LLP

(57) ABSTRACT

In accordance with an embodiment, an electronic circuit includes a first transistor device, at least one second transistor device, and a drive circuit. The first transistor device is integrated in a first semiconductor body, and includes a first load pad at a first surface of the first semiconductor body and a control pad and a second load pad at a second surface of the first semiconductor body. The at least one second transistor device is integrated in a second semiconductor body, and includes a first load pad at a first surface of the second semiconductor body and a control pad and a second load pad at a second surface of the second semiconductor body. The first load pad of the first transistor device and the first load pad of the at least one second transistor device are mounted to an electrically conducting carrier.

20 Claims, 6 Drawing Sheets

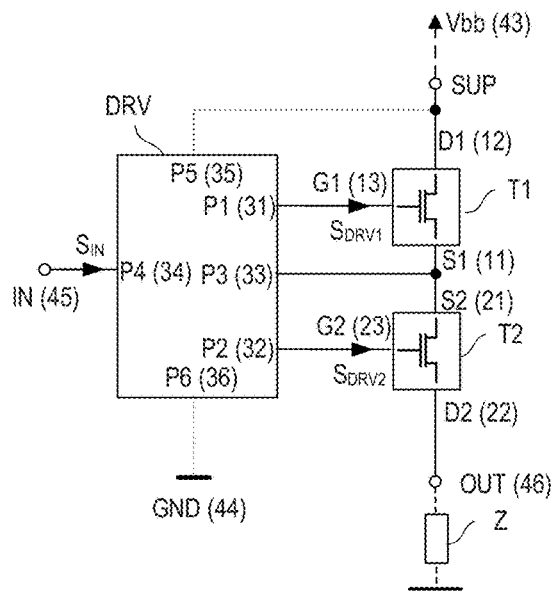
FIG 1
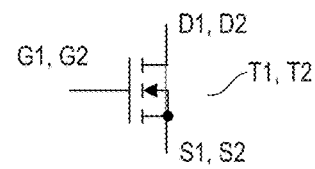
FIG 2
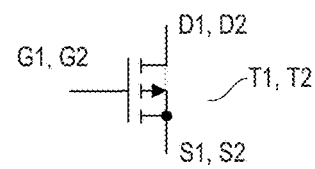
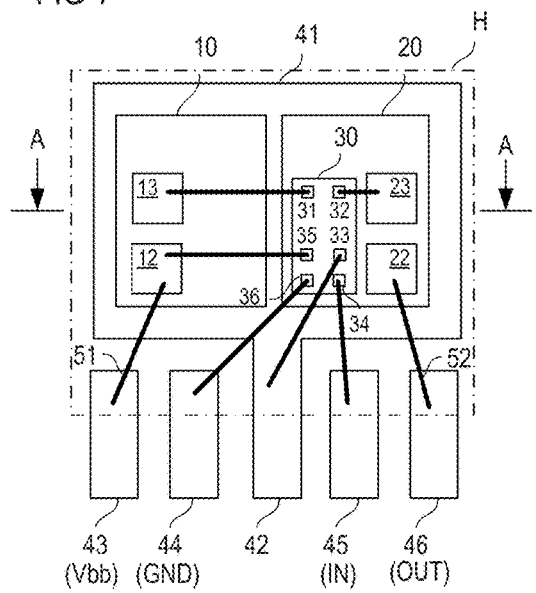
FIG 4A
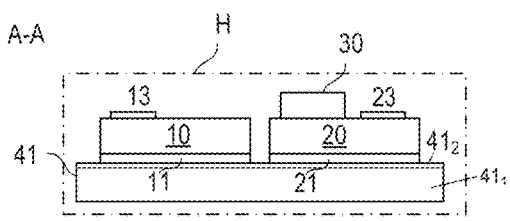
FIG 3
FIG 4B
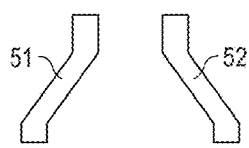
FIG 5A
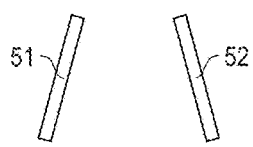
FIG 5B

… … …

ELECTRONIC SWITCHING AND REVERSE POLARITY PROTECTION CIRCUIT

This application claims priority to German patent application No. 102016112162.2, filed on Jul. 4, 2016, which application is hereby incorporated herein by reference in its entirety.

TECHNICAL FIELD

This disclosure in general relates to an electronic circuit, in particular an electronic switching and reverse polarity protection circuit.

BACKGROUND

Field-effect controlled transistor devices such as MOSFETs (Metal Oxide Field-Effect Transistors) are widely used as electronic switches in different types of applications such as automotive, industrial, household, or consumer electronic applications. A MOSFET is a voltage controlled device that includes a control node and a load path between two load nodes, and switches on or off dependent on a drive voltage received between the control node and one of the load nodes. Usually, the control node is referred to as gate node, the load nodes are referred to as drain node and source node, respectively, and the voltage that controls the MOSFET is referred to as gate-source voltage. A MOSFET usually includes an internal diode (often referred to as body diode) between the two load nodes. Due to this diode the MOSFET can be switched on and off by the drive voltage only if a load path voltage applied between the load nodes has a polarity that reverse biases the internal diode. If the load path voltage forward biases the internal diode the MOSFET conducts a current independent of the drive voltage.

There is a need to provide an integrated circuit that is capable of switching off dependent on a drive voltage and independent of a polarity of a load path voltage.

SUMMARY

One embodiment relates to an electronic circuit. The electronic circuit includes a first transistor device, at least one second transistor device, and a drive circuit. The first transistor device is integrated in a first semiconductor body, includes a first load pad at a first surface of the first semiconductor body and a control pad and a second load pad at a second surface of the first semiconductor body, and is configured to switch on or off dependent on a first drive voltage received between the control pad and the first load pad. The at least one second transistor device is integrated in a second semiconductor body, includes a first load pad at a first surface of the second semiconductor body and a control pad and a second load pad at a second surface of the second semiconductor body, and is configured to switch on or off dependent on a second drive voltage received between the control pad and the first load pad. The drive circuit is configured to generate the first drive voltage and the second drive voltage. The first load pad of the first transistor device and the first load pad of the at least one second transistor device are mounted to an electrically conducting carrier so that the load paths of the first transistor device and the at least one second transistor device are connected in series.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

FIG. 1 shows a circuit diagram of an electronic circuit with a first transistor device, a second transistor device, and a drive circuit, according to one example;

FIG. 2 illustrates one example of how the first transistor device and the second transistor device may be implemented;

FIG. 3 shows another example of how the first transistor device and the second transistor device may be implemented;

FIGS. 4A and 4B show a top view and a vertical cross sectional view, respectively, of a semiconductor chip arrangement that includes the electronic circuit shown in FIG. 1;

FIGS. 5A and 5B show different examples of how connection lines illustrated in FIG. 4A may be implemented;

DETAILED DESCRIPTION OF ILLUSTRATIVE EMBODIMENTS

Figure 6:
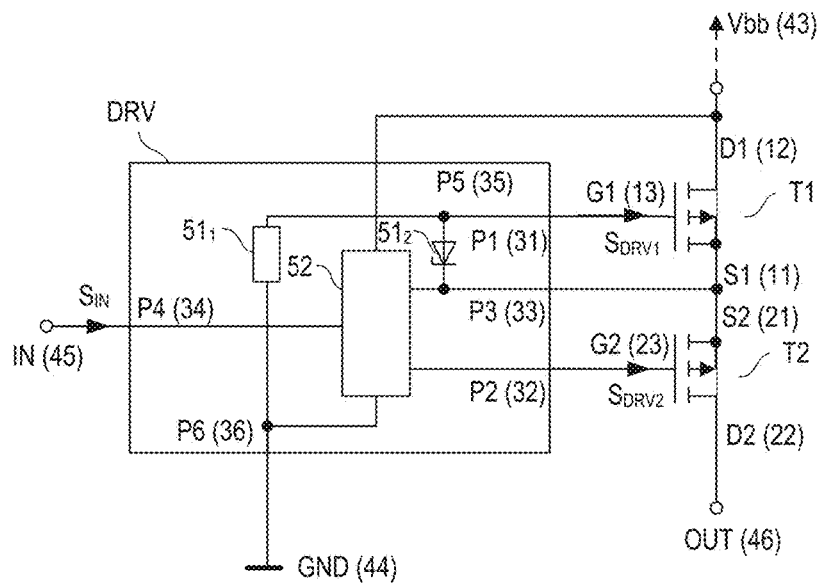
FIG. 6 shows one example of the drive circuit in greater detail.

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

FIG. 1 shows an electronic circuit diagram of an electronic circuit according to one example. The electronic circuit includes a first transistor device T1, a second transistor device T2, and a drive circuit DRV. The first transistor device T1 includes a control mode G1, a first load node S1, and a second load node D2 and is configured to switch on or off dependent on a first drive voltage $V_{GS1}$ applied between the control mode G1 and the first load node S1. The second transistor device T2 includes a control mode G2, and a first load node S1 and a second load node D2 and is configured to switch on or off dependent on a second drive voltage $V_{GS2}$ applied between the control node G2 and the first load node S2. The first load node S1 of the first transistor device T1 is connected to the first load node S2 of the second transistor device T2. The drive circuit DRV generates the first drive voltage $V_{GS1}$ and the second drive voltage $V_{GS2}$. The first drive voltage $V_{GS1}$ and the second drive voltage $V_{GS2}$ are referenced to the circuit node to which the first load node S1 of the first transistor device T1 and the first load node S2 of the second transistor device T2 are connected to. This circuit node is referred to as common source node in the following.

Each of the first transistor device T1 and the second transistor device T2 includes a load path between the respective first load node D1, D2 and the respective second load node S1, S2. The load paths of the first transistor device T1 and the second transistor device T2 form a series circuit as the first transistor device T1 and the second transistor device T2 are connected at their respective first load S1, S2.

According to one example, the electronic circuit shown in FIG. 1 operates as an electronic switch, in particular a reverse polarity protected electronic switch. For this, the series circuit formed by the first transistor device T1 and the second transistor device T2 is connected in series with a load Z, and the series circuit with the first transistor device T1, the second transistor device T2, and the load Z is connected between a first supply mode where a first supply potential Vbb is available and a second supply mode, where a second supply potential GND is available. According to one example, the second supply potential GND is lower than the first supply potential. The second supply potential GND may be ground. A voltage between the first supply node and the second supply node is referred to as supply voltage V in the following.

According to one example, the drive circuit DRV is configured to drive one of the first transistor device T1 and the second transistor device T2 dependent on a polarity of the supply voltage V and drive the other one of the first transistor device T1 and the second transistor device T2 dependent on an input signal $S_{IN}$. According to one example, the drive circuit DRV generates the first drive voltage $V_{GS1}$ between a first output pin P1 and a third output pin P3, generates the second drive voltage $V_{GS2}$ between a second output pin P2 and the third output pin P3, and receives the input signal $S_{IN}$ at an input pin P4. The input pin is also referred to as fourth pin P4 in the following. For detecting the polarity of the supply voltage V, the drive circuit DRV is configured to receive the supply voltage V between a fifth pin P5 and the sixth pin P6.

According to one example, the drive circuit DRV is configured to switch on the one of the first transistor device T1 and the second transistor device T2 if the supply voltage V has a first polarity, and is configured to switch off the one of the first transistor device T1 and the second transistor device T2 if the supply voltage V has a second polarity opposite the first polarity. The series circuit with the first transistor device T1 and the second transistor device T2 conducts (is in an on-state) if both, the first transistor device T1 and the second transistor device T2 are switched on (are in the on-state), and the series circuit with the first transistor device T1 and the second transistor device T2 blocks (is in an off-state) if at least one of the first transistor device T1 and the second transistor device T2 is switched off (is in the off-state). Thus, if the supply voltage V has the first polarity, the series circuit with first transistor device T1 and the second transistor device T2 is in the on-state dependent on the input signal $S_{IN}$ received by the drive circuit DRV. If the supply voltage V has the second polarity, the series circuit with the first transistor device T1 and the second transistor device T2 is in the off-state independent of the input signal $S_{IN}$. In this way, the electronic circuit acts as a reverse polarity protected switch that switches on and off dependent on the input signal $S_{IN}$ if the supply voltage V has the first polarity, and always switches off if the supply voltage V has the second polarity. By this, the load Z is protected against receiving the supply voltage V with the second polarity.

According to one example, the supply voltage V has the first polarity if the first supply potential Vbb is positive and the second supply potential GND is negative or ground. In the example shown in FIG. 1, the electronic circuit is depicted as a high-side switch. In this case, the series circuit with the first transistor device T1 and the second transistor device T2 is connected between the load Z and the first supply node (Vbb), and the load is connected between the series circuit and the second supply node (GND). A circuit node of the electronic circuit where the load Z can be connected thereto is referred to as output node OUT in the following. A circuit node, where a supply node can be connected thereto is referred to as supply node SUP in the following.

According to an example, shown in FIG. 2, each of the first transistor device T1 and the second transistor device T2 is implemented as an n-type MOSFET. In this case, the respective control node G1, G2 is a gate node, the respective first load node S1, S2, is a source node, and the respective second load node D1, D2 is a drain node. FIG. 2 shows a circuit symbol of an n-type MOSFET. In this example, the n-type MOSFET is drawn as an enhancement MOSFET. This, however, is only an example. According to another example (not shown), the n-type MOSFET is a depletion MOSFET. According to one example, each of the first transistor device T1 and the second transistor device T2 is an n-type enhancement MOSFET. According to another example, each of the first transistor device T1 and the second transistor device T2 is an n-type depletion MOSFET. According to yet another example, one of the first type transistor device T1 and the second type transistor device T2 is an n-type enhancement MOSFET and the other one of the first transistor device T1 and the second transistor device T2 is an n-type depletion MOSFET.

According to an example shown in FIG. 3, each of the first transistor device T1 and the second transistor device T2 is implemented as an p-type MOSFET. In this case, the respective control node G1, G2 is a gate node, the respective first load node S1, S2, is a source node, and the respective second load node D1, D2 is a drain node. FIG. 3 shows a circuit symbol of an p-type MOSFET. In this example, the p-type MOSFET is drawn as an enhancement MOSFET. This, however, is only an example. According to another example (not shown), the p-type MOSFET is a depletion MOSFET. According to one example, each of the first transistor device T1 and the second transistor device T2 is an p-type enhancement MOSFET. According to another example, each of the first transistor device T1 and the second transistor device T2 is an p-type depletion MOSFET. According to yet another example, one of the first type transistor device T1 and the second type transistor device T2 is an p-type enhancement MOSFET and the other one of the first transistor device T1 and the second transistor device T2 is an p-type depletion MOSFET.

FIGS. 4A and 4B show one example of the electronic circuit shown in FIG. 1 on a package level. That is, FIGS.

4A and 4B show a semiconductor arrangement (semiconductor package) according to one example that includes the electronic circuit shown in FIG. 1. FIG. 4A shows a top view of the semiconductor arrangement, and FIG. 4B shows a vertical cross sectional view in a section plane A-A. Referring to FIGS. 4A and 4B, the semiconductor arrangement includes a first semiconductor body (semiconductor die, semiconductor chip) 10 in which the first transistor device T1 is integrated. The first semiconductor body 10 includes a first load pad 11 at a first surface, and a second load pad 12 and a control pad 13 at a second surface opposite the first surface. The first load pad 11 forms the first load node S1, the second load pad 12 forms the second load node D1, and the control pad 13 forms the control node G1 of the first transistor device T1. Furthermore, the semiconductor arrangement includes a second semiconductor body (semiconductor chip) 20 in which the second transistor device T2 is integrated. The second semiconductor body 20 includes a first load pad 21 at a first surface, and a second load pad 22 and a control pad 23 at a second surface opposite the first surface. The first load pad 21 forms the first load node S2, the second load pad 22 forms the second load node D2, and the control pad 23 forms the control node G2 of the second transistor device T2. In FIG. 1, reference characters in brackets next to the reference characters of the individual circuit nodes of the first and second transistor device T1, T2 denote the reference characters shown in FIG. 4A of the pads that form the respective circuit nodes.

Referring to FIG. 4B, the first load pad 11 of the first transistor device T1 integrated in the first semiconductor body 10 is mounted to an electrically conducting carrier 41, and the first load pad 21 of the second transistor device T2 integrated in the second semiconductor body 20 is mounted to the electrically conducting carrier 41. Mounting the first load pad 11, 21 of each of the first semiconductor body 10 and the second semiconductor body 20 to the electrically conducting carrier 41 may include at least one of soldering, welding, and gluing using an electrically conducting glue, so as to electrically connect each of the first load pads 11, 21 to the electrically conducting carrier 41. By this, the first load nodes S1, S2 of the first transistor device T1 and the second transistor device T2 are electrically connected with each other. FIG. 4B is a schematic representation of the semiconductor arrangement so that a connection layer, such as a solder layer or a glue, between the carrier 41 and the respective first load pad 11, 21 is not shown.

The electrically conducting carrier 41 can be comprised of an electrically conducting material as a hole. Alternatively (as illustrated in dotted lines in FIG. 4B), the carrier 41 includes an electrically insulating layer $41_1$, and an electrically conducting layer $41_2$ on the insulating layer $41_1$, wherein the load pads 11, 21 are mounted to the electrically conducting layer $41_2$.

Referring to FIGS. 2 and 3, each of the first transistor device T1 and the second transistor device T2 may be implemented as MOSFETs. In this case, the first load pad 11 of the first transistor device T1 forms the source node S1, and the first load pad 21 of the second transistor device T2 forms the source node S2 of the second transistor device T2. In this case, the first transistor device T1 and the second transistor device T2 may each be implemented as a source-down MOSFET, which is a MOSFET that has the source node at a first surface of the semiconductor body in which it is integrated and the drain node and the gate node at a second surface opposite the first surface.

Referring to FIG. 4A, the semiconductor arrangement includes a third semiconductor body (semiconductor chip) 30 in which the drive circuit DRV is integrated. According to one example, as shown in FIG. 4B, the third semiconductor body 30 is arranged on one of the first semiconductor body 10 and the second semiconductor body 20. Just for the purpose of illustration, the third semiconductor body 30 is arranged on the second semiconductor body 20 in the example shown in FIG. 4B. On an upper surface, which is a surface facing away from the second semiconductor body 20, the third semiconductor body 30 includes a plurality of pads, with each of these pads forming one of the input and output pins P1-P6 shown in FIG. 1. The reference character of the pad that forms the respective input or output pin is given in brackets next to the reference character of the respective pin in FIG. 1. A first pad 31 forms the first output pin P1 and is electrically connected to the control pad 13 of the first semiconductor body 10, a second pad 32 forms the second output pin P2 and is electrically connected to the control pad 23 of the second semiconductor body 20; a third pad 33 forms the third output pin P3 and is electrically connected to the first load pads 11, 21 via the carrier 41, a fourth pad 34 which forms the input pin P4 of the drive circuit DRV is electrically connected to an electrically conducting leg 45 that forms the input IN of the electronic circuit, a pad 35 which forms one P5 of the supply input pins P5, P6 of the drive circuit DRV is connected to the second load pad of the first transistor device T1, and a sixth pad 36 forms the second supply input pin P6 and is connected to another electrically conducting leg 44. Furthermore, the second load pad 12 of the first transistor device T1 is connected to a first supply leg 43, and the second load pad 22 of the second transistor device T2 is connected to a second supply leg 46. The legs 43-46 are electrically insulated from the carrier 41. The third pad 33 of the third semiconductor body 30 is connected to another leg that is electrically connected to the carrier 41.

Referring to FIGS. 4A and 4B, semiconductor arrangement further includes a housing H (illustrated in dashed and dotted lines in FIGS. 4A and 4B). This housing, which may also be referred to as package, surrounds the semiconductor bodies 10, 20, 30 and the carrier 41. The legs 43-46 protrude from the housing. Optionally, the leg 42 that is electrically connected to the carrier 41 also protrudes from the housing.

In FIG. 4A, the bold lines between pads or between pads and legs represent electrically conducting connections. These connections can be implemented in different ways. Just for the purpose of explanation, FIGS. 5A and 5B show two of these connections 51, 52 in greater detail, namely the connections between the second load pads 12, 22 and the respective supply legs 43, 46. In the example shown in FIG. 5A, these connections 51, 52 are implemented as flat conductors that have been cut from a metal sheet. According to another example, shown in FIG. 5B, these connections are implemented as bond wires. Each of the other connections shown in FIG. 4A but not labeled with a reference character can be implemented as flat conductor or a bond wire equivalently.

Referring to the above, the drive circuit DRV is configured to switch on or off one of the first and second transistor devices T1, T2 dependent on a polarity of the supply voltage V. FIG. 6 shows one example of the drive circuit with such a function in greater detail. In this example, the first transistor device T1 and the second transistor device T2 are each implemented as a p-type MOSFET, and the drive circuit DRV is configured to drive the first transistor device T1 dependent on the polarity of the supply voltage V. The drive circuit DRV includes a reverse polarity protection circuit 51 connected between the gate node G1 or the gate pad 13, respectively, of the first transistor device T1 and the second supply pin P6 of the drive circuit DRV. In operation of the drive circuit DRV, the second supply pin P6 is connected to the second supply node 44. In the example shown in FIG. 6, the reverse polarity protection circuit includes a resistor 51, connected between the gate node G1 and the second supply pin P6. In operation of the electronic circuit, the supply voltage V is the voltage between the drain node D1 of the first transistor device T1 and the second supply pin P6. The first transistor device T1, when implemented as a p-type MOSFET, switches on, when the first drive voltage $V_{GS1}$ is negative and below the negative threshold voltage. When the supply voltage V has a polarity as shown in FIG. 6, that is, when the electrical potential at the second supply node P6 is lower than the electrical potential at the drain node D1, the first transistor device T1 switches on. When, however, the supply voltage V has a polarity opposite the polarity shown in FIG. 6 so that the electrical potential at the second supply pin P6 is higher than the electrical potential at the drain node D1, the first transistor device T1 switches off.

The second transistor device T2 is driven by a drive unit 52 connected between the second output pin P2 and the third output pin P3 and receiving the input signal $S_{IN}$ from the input pin P4. This drive unit 52 is configured to switch on or off the second transistor device T2 dependent on the input signal $S_{IN}$. Optionally, the drive unit 52 is connected between the first and second supply pins P5, P6 so as to receive the supply voltage V and uses the supply voltage V to generate the second drive voltage $V_{GS2}$.

Figure 17:
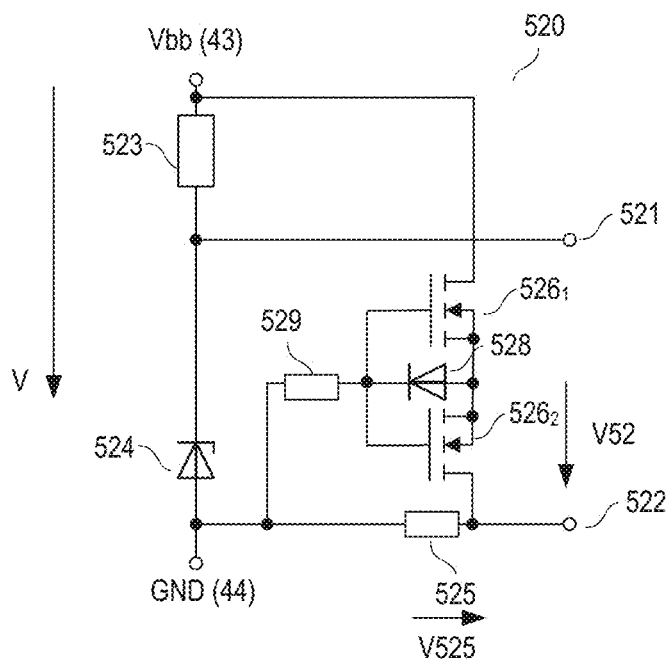
FIG. 17 shows one example of an internal supply circuit configured to generate an internal supply voltage independent of a polarity of an external supply voltage.

FIG. 17 shows one example of a supply circuit 520 that may be included in the drive unit 52 and generates an internal supply voltage V52 of the drive unit 52 from the supply voltage V between the first supply potential Vbb and the second supply potential GND independent of a polarity of this supply voltage V, which will be referred to as external supply voltage in the following. This circuit 520 is connected to the first and second supply nodes (where the first and second supply potentials Vbb, GND are available) and provides the internal supply voltage V52 at first and second output nodes 521, 522. Referring to FIG. 17, the supply circuit includes a series circuit with a first resistor 523 and a voltage limiting element 524, connected between the first and second supply nodes. The first output node 521 is connected to a circuit node between the first resistor 523 and the voltage limiting element 524, and the second output node 522 is connected to the second supply node via a second resistor.

Furthermore, an electronic switch has its load path connected between the first supply node and the second output node 522. This electronic switch is driven by a voltage V525 across the second resistor. In the example shown in FIG. 17, the electronic switch includes a first MOSFET $526_1$ and a second MOSFET $526_2$ of the same type (n-type in this example). These MOSFETs are connected such that their internal body diodes (not shown) are connected in an anti-serial configuration. Referring to FIG. 17 this can be obtained by connecting the first MOSFET $526_1$ and the second MOSFET $526_2$ at their respective source node. Gate nodes of the MOSFETs $526_1$, $526_2$ are connected with each other and, via an optional resistor 529, connected to a circuit node between the second resistor 525 and the second supply node. Optionally, a rectifier element 528, such as a diode is connected between the gate nodes and the common source node. This rectifier element 528 protects the MOSFETs $526_1$, $526_2$ against high voltages between the gate and source nodes.

In the supply circuit shown in FIG. 17, the internal supply voltage V52 substantially equals the external supply voltage V if the first supply potential is positive relative to the second supply potential GND, that is, when the supply voltage V is not reverse biased. In this case, the voltage across the resistor V525 is substantially zero and the electronic switch $526_1$, $526_2$ is switched off. When the supply voltage is reverse biased, so that the second supply potential GND is positive relative to the first supply potential, the internal supply voltage substantially equals −V, that is, the negative external supply voltage V. In this case, the second supply potential GND is applied to the first output node 521 via the rectifier element, a voltage across the second resistor 525 adjusts such that the electronic switch switches on and applies the first supply potential Vbb to the second output node 522. In this supply circuit 520, the internal supply voltage V52 has the same polarity independent of the polarity of the external supply voltage V.

Optionally, the reverse polarity protection circuit 51 includes a voltage limiting element $51_2$ connected between the gate node G1 and the source node S1 of the first transistor device T1. This voltage limiting element $51_2$ is implemented as a Zener diode, for example, and serves to limit the first drive voltage $V_{GS1}$.

Figure 7:
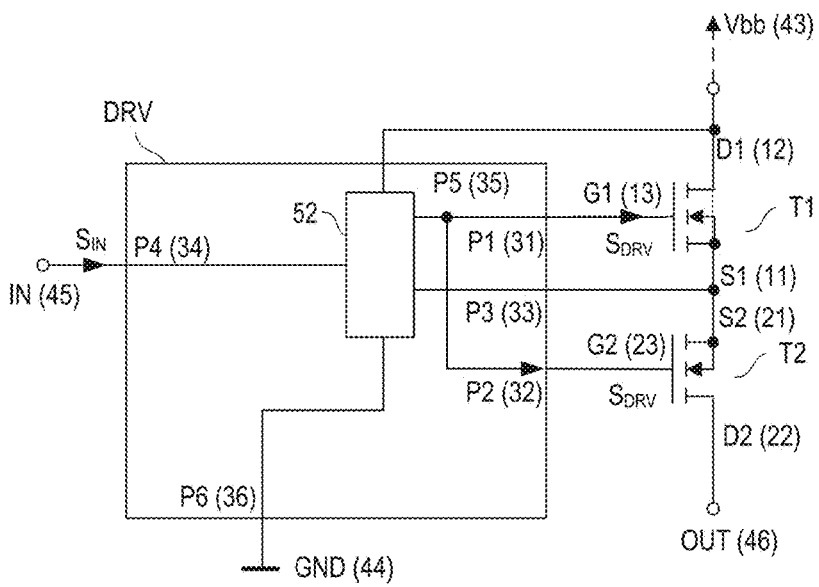
FIG. 7 shows another example of the drive circuit in greater detail.

FIG. 7 shows a drive circuit DRV according to another example. In this example, each of the first transistor device T1 and the second transistor device T2 is implemented as an n-type MOSFET. In this example, the drive unit 52 receives the external supply voltage, is configured to detect the polarity of the external supply voltage and is configured to switch off both the first transistor device T1 and the second transistor device T2 if a reverse polarity of the external supply voltage is detected. In a normal mode, that is, if there is no reverse polarity of the external supply voltage, the drive unit switches both the first transistor device T1 and the second transistor device T2 based on the input signal $S_{IN}$. In the example shown in FIG. 7, the first transistor device T1 and the second transistor device T2 have their gate nodes connected so that the two transistors t1, T2 receive the same drive signal $S_{DRV}$.

Referring to FIG. 7, the drive circuit DRV further includes a drive unit 52 that is configured to generate the first drive voltage $V_{GS1}$ dependent on the input signal $S_{IN}$. In particular, the drive unit 52 is configured to switch on or off the first transistor device T1 dependent on the input signal $S_{IN}$. Like in the drive unit 52 shown in FIG. 6, the drive unit 52 shown in FIG. 7 may receive the supply voltage V via the first and second supply pins P5, P6 of the drive circuit DRV.

In the example shown in FIGS. 4A and 4B, the first semiconductor body 10 and the second semiconductor body 20 are depicted as separate semiconductor bodies that are spaced apart from each other. This, however, is only an example. According to another example, shown in FIG. 8, the first semiconductor body 10, in which the first transistor device T1 is integrated, and the second semiconductor body 20 in which the second transistor device T2 is integrated, can be different sections of one semiconductor body. That is, the first transistor device T1 and the second transistor device T2 can be integrated in one semiconductor body, from which the first semiconductor body 10 explained before forms one section and the second semiconductor body 20 explained before forms another section.

Figure 8:
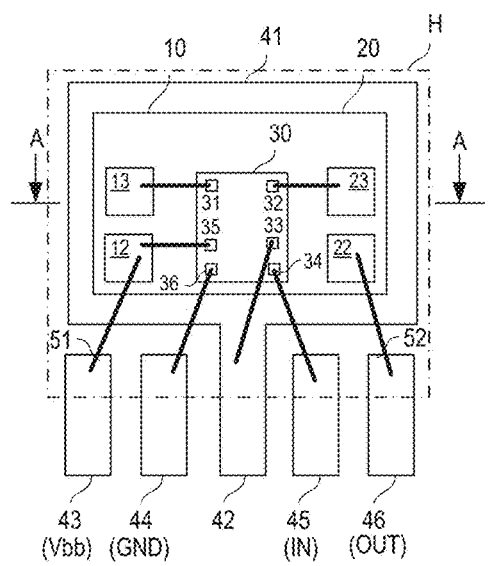
FIG. 8 shows a semiconductor chip arrangement that includes the electronic circuit shown in FIG. 1, according to another example.
Figure 9:
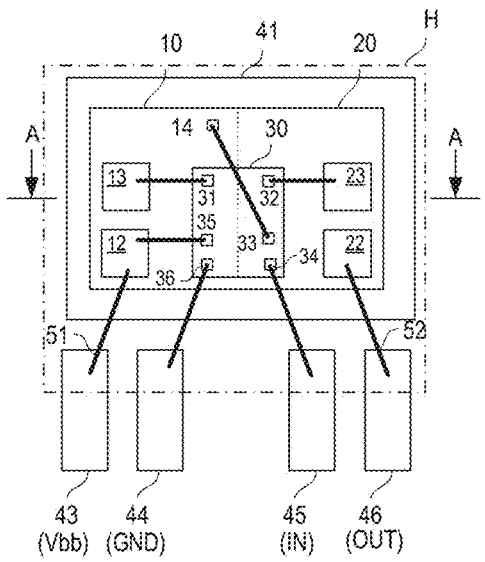
FIG. 9 shows a semiconductor chip arrangement that includes the electronic circuit shown in FIG. 1, according to yet another example.

FIG. 9 shows a modification of the semiconductor arrangements explained with reference to FIGS. 4A-4B and 8 before. In the example shown in FIG. 9, one of the first and second semiconductor bodies 10, 20 includes a pad 14 at the second surface that is electrically connected to the respective first load pad (11 or 21 shown in FIG. 4B) at the first surface. In this case, the third pad 33 of the drive circuit (which, referring to FIG. 1, forms the third output pin P3) is connected to this pad 14. The leg 42 (see FIGS. 4A and 8) connected to the carrier 41 can be omitted in this example. In the example shown in FIG. 9, the first semiconductor body 10 includes the additional pad 14 connected to the respective first load pad. This, however, is only an example. According to another example (not shown) the second semiconductor body 20 includes such additional pad. Although the first semiconductor body 10 and the second semiconductor body 20 are drawn to be part of one semiconductor body in the example shown in FIG. 9, these first and second semiconductor bodies 10 and 20 could be implemented as separate semiconductor bodies as well (this is illustrated by the dotted line in FIG. 9).

Figure 10:
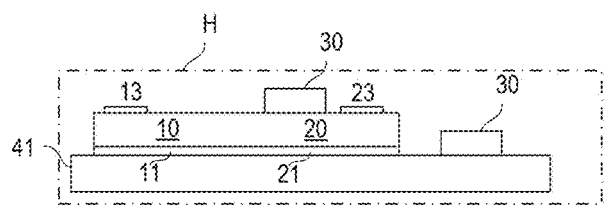
FIG. 10 shows a semiconductor chip arrangement that includes the electronic circuit shown in FIG. 1, according to a further example.

In the examples explained before, the third semiconductor body 30, in which the drive circuit DRV is integrated, is arranged on the second surface of at least one of the first and second semiconductor bodies 10, 20. In the example shown in FIG. 9, the third semiconductor body 30 is partially arranged on each of the first semiconductor body 10 and the second semiconductor body 20. According to another example, shown in FIG. 10, the third semiconductor body 30 could also be arranged on the carrier 41 next to the first semiconductor body 10 and the second semiconductor body 20.

Figure 11:
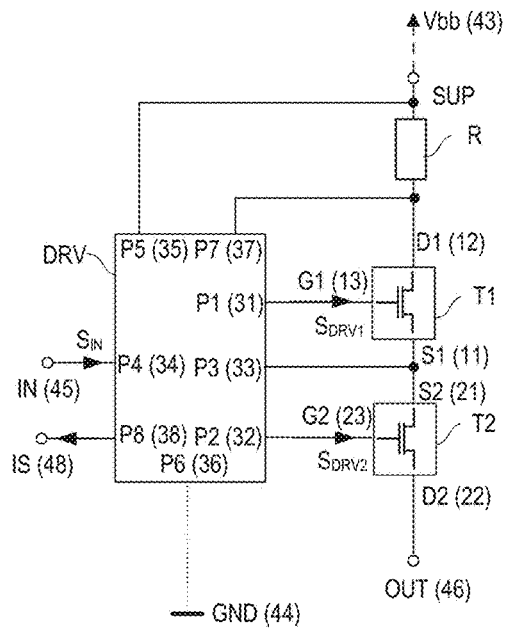
FIG. 11 shows an electronic circuit diagram of an electronic circuit according to another example.

FIG. 11 shows a modification of the electronic circuit shown in FIG. 1. The electronic circuit shown in FIG. 11 includes a sense resistor R connected in series with the load paths of the first transistor device T1 and the second transistor device T2. In this example, the sense resistor R is connected between the supply node SUP and the second load node D1 of the first transistor device T1. The drive circuit DRV, besides the first supply pin P5 connected to the supply node SUP, includes another input pin P7 connected to the second load node D1 of the first transistor device T1. The drive circuit DRV is configured to detect a voltage Vs between the first supply pin P5 and the other input pin P7. This voltage Vs represents a current $I_L$ flowing through the sense resistor R when the electronic circuit is in the on-state. In particular, the voltage Vs is proportional to the load current $I_L$, wherein a proportionality factor is given by a resistance of the sense resistor R. According to one example, the drive circuit DRV includes another output pin P8 and is configured to output a signal $S_{OUT}$ at this output pin P8 that represents the load current $I_L$.

Figure 12:
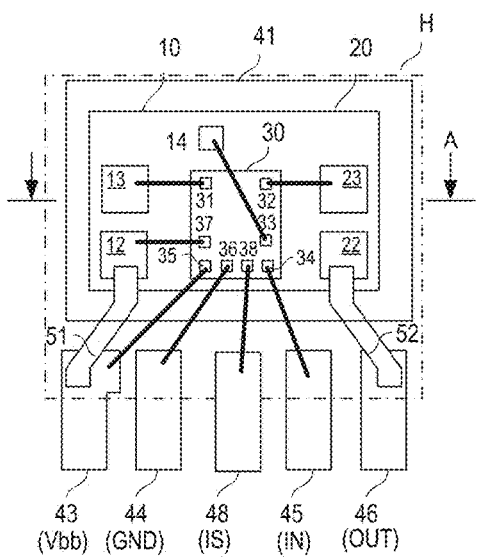
FIG. 12 shows a semiconductor chip arrangement that includes the electronic circuit shown in FIG. 11.

FIG. 12 shows the electronic circuit shown in FIG. 11 on a package level. The semiconductor arrangement shown in FIG. 12 is a modification of the semiconductor arrangement shown in FIG. 9 and is different from the semiconductor arrangement shown in FIG. 9 in that the third semiconductor body 30 includes a seventh pad 37 and an eights pad 38. The seventh pad 37 is connected to the first supply leg 43, while the fifth pad 35 is connected to the second load pad 12. The conductor 51 between the second load pad 12 of the first semiconductor body 10 and the supply leg 43 forms the sense resistor R in this example. According to one example, the conductor 51 is implemented as a flat conductor of the type shown in FIG. 5A.

In the example shown in FIG. 12, the first semiconductor body 10 and the second semiconductor body 20 are formed by one semiconductor body, and the first semiconductor body 10 includes a pad 14 connected to the first load pad 11 (see FIG. 4B). This, however, is only an example. The first and second semiconductor bodies could also be implemented as separate semiconductor bodies (illustrated by the dotted line in FIG. 12). The pad 14 may be omitted and the third pad 33 may be connected to the carrier 41, in the way shown in FIG. 8.

Figure 13:
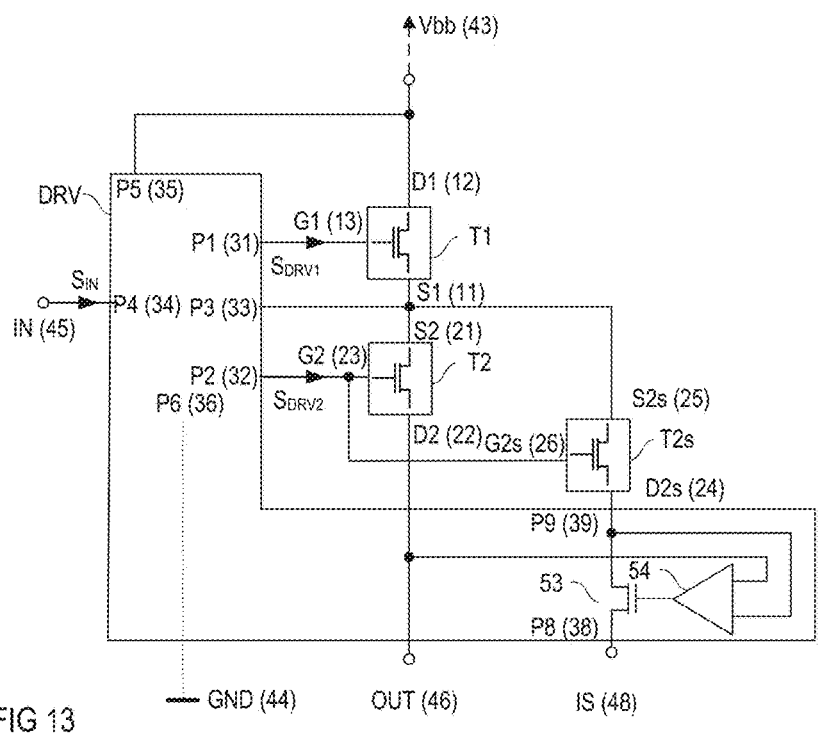
FIG. 13 shows an electronic circuit diagram of an electronic circuit with a first transistor device, a second transistor device and a sense transistor device.

FIG. 13 shows another modification of the electronic circuit shown in FIG. 1. The electronic circuit shown in FIG. 13, additionally to the first transistor device T1 and the second transistor device T2 includes a sense transistor T2s. This sense transistor T2s is of the same type as the first transistor T1 and the second transistor T2. The sense transistor T2s includes a control node G2s, a first load node S2s, and a second load node D2s. The control node G2s is connected to the control node G2 of the second transistor, and the first load node S2s is connected to the first load node S1 of the second transistor T2. The drive circuit DRV includes a control circuit 53 configured to operate the sense transistor T2s in the same operation point as the second transistor T2. In this case, a sense current Is through the sense transistor T2s is proportional to a load current $I_L$ through the second transistor T2. A proportionality factor (often referred to as $k_{ILIS}$ factor) between the load current $I_L$ and the sense current $I_S$ is given by a ratio between the size of the second transistor T2 and a size of the sense transistor T2s. This is commonly known, so that no further explanation is required in this regard. The regulation circuit 53 in the drive circuit DRV is configured to regulate the electric potential at the second load node D2s of the sense transistor T2s such that this potential substantially equals the electric potential at the second load node D2 of the second transistor device T2. An amplifier 53$_1$ such as an operational amplifier, receives the potentials at the second load nodes D2s, D2 and adjusts a resistance of an adjustable resistor 53$_2$ connected in series with the load path of the sense transistor T2s such that the potential at the second load D2s of the sense transistor T2s equals the potential at the second load D2 of the second transistor T2. Referring to FIG. 13, the regulation circuit is connected between another input pin P9 and the output pin P8 of the drive circuit DRV. At the output pin P8, which may also be referred to as sense pin, the sense current $I_S$ is available. Referring to the above, this sense current Is represents a load current $I_L$ that flows through the electronic circuit, and a load Z, in the on-state of the electronic circuit. In operation of the electronic circuit, a resistor $R_S$ can be connected between the sense pin P8 and the second supply mode GND. A voltage across the sense resistor Rs represents the sense current $I_S$ and, therefore, the load current $I_L$ in this example.

Figure 14:
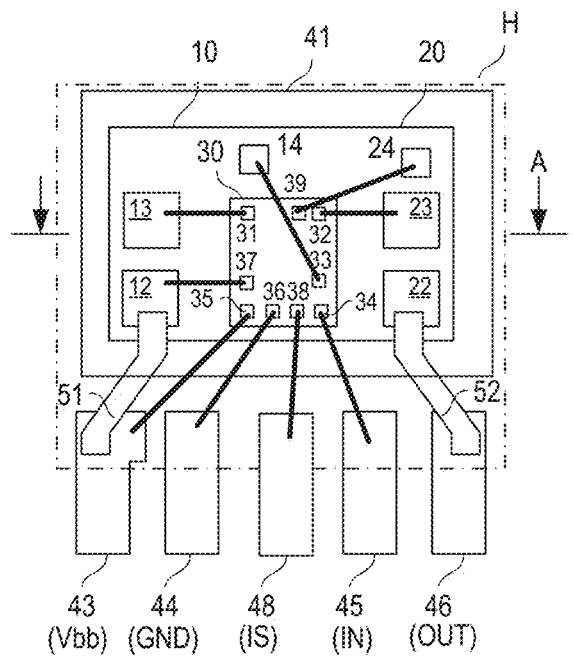
FIG. 14 shows a chip arrangement that includes the electronic circuit shown in FIG. 13.

FIG. 14 shows an example of a semiconductor arrangement in which the electronic circuit shown in FIG. 13 is implemented. This semiconductor arrangement is different from the semiconductor arrangement shown in FIG. 12 in that the second transistor device T2 and the sense transistor device T2s are integrated in the second semiconductor body 20. A sense pad 24 at the second surface of the second semiconductor body 20 forms the second load node D2s of the sense transistor T2s. This sense pad 24 is connected to another input pad 39 of the third semiconductor body 30. This input pad forms the input pin P9 shown in FIG. 13.

Figure 15:
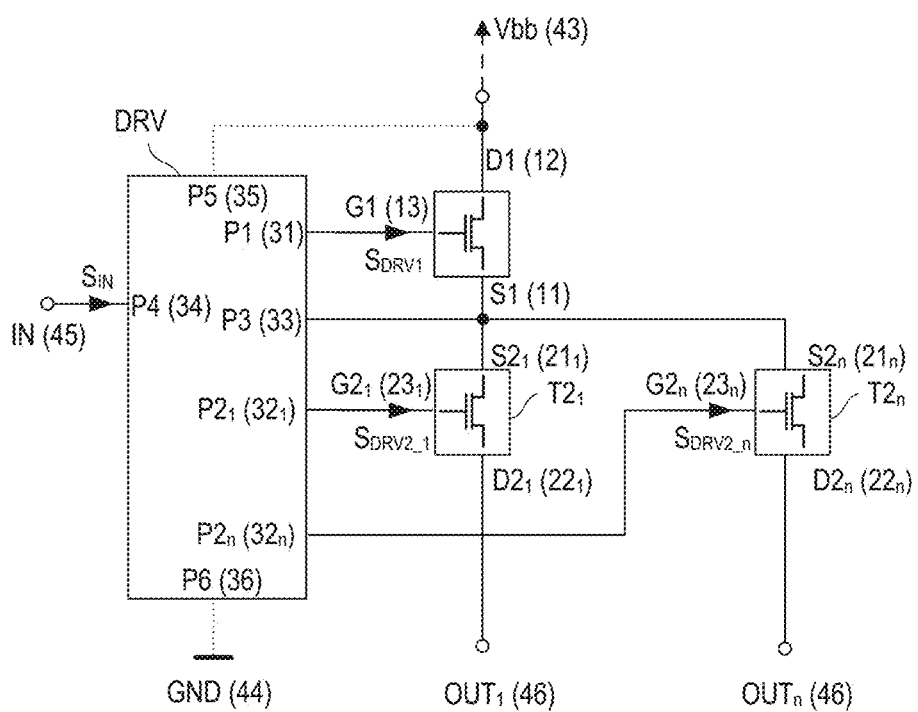
FIG. 15 shows an electronic circuit diagram of an electronic circuit that includes a first transistor device and several second transistor devices.

In the examples explained herein before, the electronic circuit includes one transistor device that is driven by the drive circuit DRV dependent on the polarity of the supply voltage V, and one transistor device that is driven by the drive circuit DRV dependent on an input signal. FIG. 15 shows one example of an electronic circuit that includes one transistor device driven by the drive circuit DRV dependent on the polarity of the drive voltage V, and several transistor devices driven by the drive circuit DRV dependent on input signals. In the example shown in FIG. 15, there are two transistor devices $T2_1$, $T2_n$ driven by the drive circuit DRV dependent on input signals $S_{IN1}$, $S_{IN2}$. This, however, is only an example. This electronic circuit can be implemented with more than two of these transistor devices $T2_1$, $T2_n$, as well. In the example shown in FIG. 15, the first transistor device T1 is the transistor device that is driven dependent on the polarity of the supply voltage V and there are several second transistor devices $T2_1$, $T2_n$. This, however, is only an example. According to another example (not shown) there is one second transistor device that is driven by the drive circuit DRV dependent on the polarity of the supply voltage V, and there are two or more first transistor devices that are driven by the drive circuit DRV dependent on input signals.

In the electronic circuit shown in FIG. 15, the first load node S1 of the first transistor device T1 and the first load nodes $S2_1$, $S2_n$ of each of the second transistor devices $T2_1$, $T2_n$ is connected to the common first load node. The load path of each of the second transistor devices $T2_1$, $T2_n$ is connected between the common first load node and a respective output node $OUT_1$, $OUT_n$. The drive circuit DRV receives a plurality of input signals $S_{IN1}$, $S_{INn}$ at a plurality of input pins $P4_1$, $P4_n$, wherein each of these input signals $S_{IN1}$, $S_{INn}$ is associated with one of the second transistor devices $T2_1$, $T2_n$ and defines the desired switching state of the respective second transistor device $T2_1$, $T2_n$. Based on these input signals $S_{IN1}$, $S_{INn}$ the drive circuit DRV generates drive voltages $V_{GS21}$, $V_{GS2n}$ received by the individual second transistor devices $T2_1$, $T2_n$. In the example shown in FIG. 15, the drive circuit DRV generates a drive circuit $V_{GS21}$ received by the second transistor device $T2_1$ between an output pin $P2_1$ and the output pin P3, and generates a drive voltage $V_{GS2n}$ received by the second transistor device $T2_n$ between an output pin $P2_n$ and the output pin P3.

Figure 16:
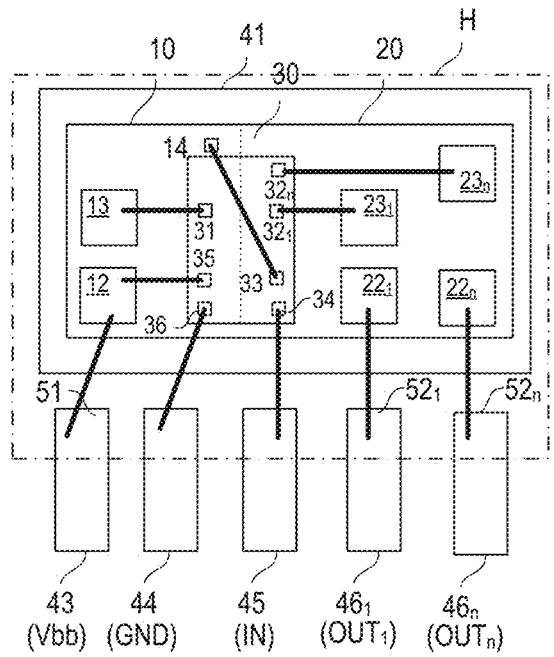
FIG. 16 shows one example of a chip arrangement that includes the electronic circuit shown in FIG. 15.

FIG. 16 shows a semiconductor arrangement in which the electronic circuit shown in FIG. 15 is implemented. In this example, the semiconductor arrangement includes a first semiconductor body 10 in which the first transistor device T1 is integrated, a third semiconductor body 30 in which the drive circuit DRV is integrated, and semiconductor bodies $20_1$, $20_n$ in each of which one of the second transistor devices $T2_1$, $T2_n$ is integrated. The semiconductor bodies 10, $20_1$, $20_n$ can be different parts of one common semiconductor body, or can be separate semiconductor bodies (illustrated by the dashed lines in FIG. 16). Input pins for receiving the input signals are formed by legs $45_1$, $45_2$, and the outputs $OUT_1$, $OUT_n$ shown in FIG. 15 are formed by output legs $46_1$, $46_n$. A control pad $23_1$ on a second surface of the semiconductor body $20_1$ forms the control node $G2_1$ of the second transistor device $T2_1$, and a control pad $23_n$ on the second surface of the semiconductor body $20_n$ forms the control node $G2_n$ of the transistor device $T2_n$. A second load pad $22_1$ on the second surface of the semiconductor body $20_1$ forms the second load node $D2_1$ of the transistor device $T2_1$, and a load pad $22_n$ on the second surface of the semiconductor body $20_n$ forms the second load node $D2_n$ of the transistor device $T2_n$. Each of these load pads $22_1$, $22_n$ is electrically connected to a respective output leg $46_1$, $46_n$. The control pads $23_1$, $23_n$ are each connected to a respective pad $32_1$, $32_n$ on the third semiconductor body 30. These pads $32_1$, $32_n$ each form one of the input pins $P2_1$, $P2_n$ shown in FIG. 15.

What is claimed is:

1. An electronic circuit, comprising:
  a first transistor device, wherein the first transistor device is integrated in a first semiconductor body, comprises a source pad at a first surface of the first semiconductor body and a control pad and a drain pad at a second surface of the first semiconductor body, and is configured to switch on or off dependent on a first drive voltage received between the control pad and the source pad;
  at least one second transistor device, wherein the at least one second transistor device is integrated in a second semiconductor body, comprises a source pad at a first surface of the second semiconductor body and a control pad and a drain pad at a second surface of the second semiconductor body, and is configured to switch on or off dependent on a second drive voltage received between the control pad and the source pad; and
  a drive circuit configured to generate the first drive voltage and the second drive voltage, wherein the source pad of the first transistor device and the source pad of the at least one second transistor device are mounted to an electrically conducting carrier so that load paths of the first transistor device and the at least one second transistor device are connected in series.

2. The electronic circuit of claim 1, wherein the first semiconductor body and the second semiconductor body are separate semiconductor bodies.

3. The electronic circuit of claim 1, wherein the first semiconductor body and the second semiconductor body are different parts of one semiconductor body.

4. The electronic circuit of claim 1, wherein the drive circuit is integrated in a third semiconductor body.

5. The electronic circuit of claim 4, wherein the third semiconductor body is arranged on at least one of the first semiconductor body and the second semiconductor body.

6. The electronic circuit of claim 4, wherein the third semiconductor body is arranged on the carrier next to at least one of the first semiconductor body and the second semiconductor body.

7. The electronic circuit of claim 1, wherein the drive circuit is configured to generate the first drive voltage and the second drive voltage based on an input signal and a polarity of a load path voltage across a series circuit with the load paths of the first transistor device and the second transistor device, respectively.

8. The electronic circuit of claim 7,
  wherein the drive circuit is configured to drive the first transistor device and the at least one second transistor device dependent on the input signal if the load path voltage has a first polarity, and
  wherein the drive circuit is configured to switch off at least one of the first transistor device and the at least one second transistor device independent of the input signal if the load path voltage has a second polarity opposite the first polarity.

9. The electronic circuit of claim 7, wherein the drive circuit comprises a supply circuit configured to generate an internal supply voltage based on the load path voltage such that the internal supply voltage has a same polarity independent of a polarity of the load path voltage.

10. The electronic circuit of claim 1, further comprising a sense transistor device integrated in the second semiconductor body,
  wherein a control node of the sense transistor device is connected to the control pad of the second transistor device,
  wherein a first load node of the sense transistor device is connected to the source pad of the second transistor device, and
  wherein the sense transistor device comprises a second load node connected to a sense pad at the second surface of the second semiconductor body.

11. The electronic circuit of claim 10,
wherein the sense pad is connected to the drive circuit, and
wherein the drive circuit is configured to generate a sense signal based on electrical potentials at the drain pad of the second transistor device and the sense pad, respectively.

12. The electronic circuit of claim 1, wherein the at least one second transistor device comprises a plurality of second transistor devices.

13. A packaged semiconductor circuit comprising:
an electrically conductive carrier;
a first transistor device integrated in a first semiconductor body disposed on the electrically conductive carrier, wherein the first transistor device comprises a source pad disposed on a first side of the first semiconductor body against the electrically conductive carrier, and a drain pad disposed on a second side of the first semiconductor body opposite the first side of the first semiconductor body;
a second transistor device integrated in a second semiconductor body disposed on the electrically conductive carrier, wherein the second transistor device comprises a source pad disposed on a first side of the second semiconductor body against the electrically conductive carrier, and a drain pad disposed on a second side of the second semiconductor body opposite the first side of the second semiconductor body; and
a drive circuit having a first output connected to a control pad of the first transistor device via a first conductive connection, and a second output connected to a control pad of the second transistor device via a second conductive connection.

14. The packaged semiconductor circuit of claim 13, wherein the first semiconductor body and the second semiconductor body are separate semiconductor bodies.

15. The packaged semiconductor circuit of claim 13, wherein the drive circuit is integrated in a third semiconductor body.

16. The packaged semiconductor circuit of claim 15, wherein the third semiconductor body is arranged on at least one of the first semiconductor body and the second semiconductor body.

17. The packaged semiconductor circuit of claim 15, wherein the first conductive connection comprises a first bond wire and the second conductive connection comprises a second bond wire.

18. A method of operating a circuit comprising an electrically conductive carrier, a first transistor device integrated in a first semiconductor body disposed on the electrically conductive carrier, a second transistor device integrated in a second semiconductor body disposed on the electrically conductive carrier, and a drive circuit having a first output connected to a control pad of the first transistor device via a first conductive connection, and a second output connected to a control pad of the second transistor device via a second conductive connection, wherein the first transistor device comprises a source pad disposed on a first side of the first semiconductor body against the electrically conductive carrier and a drain pad disposed on a second side of the first semiconductor body opposite the first side of the first semiconductor body, and the second transistor device comprises a source pad disposed on a first side of the second semiconductor body against the electrically conductive carrier and a drain pad disposed on a second side of the second semiconductor body opposite the first side of the second semiconductor body, the method comprising:
generating a first drive voltage at the first output of the drive circuit; and
generating a second drive voltage at the second output of the drive circuit.

19. The method of claim 18, wherein the first drive voltage and the second drive voltage are based on an input signal and a polarity of a load path voltage across a series circuit that includes load paths of the first transistor device and the second transistor device.

20. The method of claim 19, wherein:
the first drive voltage and the second drive voltage turn on the first transistor device and the second transistor device dependent on the input signal when the load path voltage has a first polarity; and
the first drive voltage and the second drive voltage turn off the first transistor device and the second transistor device when the load path voltage has a second polarity opposite the first polarity.

* * * * *